(12) United States Patent
Sewald et al.

(10) Patent No.: US 8,638,565 B2
(45) Date of Patent: Jan. 28, 2014

(54) ARRANGEMENT OF OPTOELECTRONIC COMPONENTS

(75) Inventors: Rainer Sewald, Taufkirchen (DE); Markus Kirsch, Brunn (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 724 days.

(21) Appl. No.: 12/442,414

(22) PCT Filed: Sep. 21, 2007

(86) PCT No.: PCT/DE2007/001714
§ 371 (c)(1),
(2), (4) Date: Sep. 3, 2009

(87) PCT Pub. No.: WO2008/040307
PCT Pub. Date: Apr. 10, 2008

(65) Prior Publication Data
US 2010/0079964 A1    Apr. 1, 2010

(30) Foreign Application Priority Data

Sep. 25, 2006   (DE) .................... 10 2006 045 129
Dec. 14, 2006   (DE) .................... 10 2006 059 127

(51) Int. Cl.
*H05K 7/02*   (2006.01)
*H05K 7/06*   (2006.01)
*H05K 7/08*   (2006.01)
*H05K 7/10*   (2006.01)

(52) U.S. Cl.
USPC ........... 361/783; 361/760; 361/763; 361/777; 361/779; 361/792; 174/259; 174/264

(58) Field of Classification Search
USPC .......... 174/259–264; 257/727–730, 778–780; 361/760–764, 782–784, 792–795, 803
See application file for complete search history.

(56) References Cited

U.S. PATENT DOCUMENTS

| | | | |
|---|---|---|---|
| 4,417,296 A | | 11/1983 | Schelhorn |
| 5,006,920 A | | 4/1991 | Schafer et al. |
| 5,109,269 A | | 4/1992 | Holzman |
| 5,196,371 A | | 3/1993 | Kulesza et al. |
| 5,808,873 A | | 9/1998 | Celaya et al. |
| 6,812,410 B2 | * | 11/2004 | Sakamoto et al. ............ 174/260 |
| 6,906,425 B2 | * | 6/2005 | Stewart et al. ................ 257/778 |
| 2002/0050397 A1 | | 5/2002 | Sakamoto et al. |
| 2002/0154869 A1 | * | 10/2002 | Chan et al. ...................... 385/88 |
| 2003/0164505 A1 | | 9/2003 | Streubel et al. |
| 2004/0108135 A1 | | 6/2004 | Ashida |
| 2004/0129991 A1 | * | 7/2004 | Lai et al. ........................ 257/433 |
| 2006/0105607 A1 | | 5/2006 | Hougham et al. |
| 2007/0291503 A1 | | 12/2007 | Friedrich et al. |

FOREIGN PATENT DOCUMENTS

| | | |
|---|---|---|
| DE | 25 28 000 | 1/1977 |
| DE | 37 35 455 | 10/1991 |
| DE | 101 58 754 | 6/2003 |
| GB | 2 146 177 | 4/1985 |

(Continued)

*Primary Examiner* — Tuan T Dinh
(74) *Attorney, Agent, or Firm* — Cozen O'Connor

(57) ABSTRACT

A method for producing an arrangement of optoelectronic components (10) is specified, comprising the following steps: producing at least two fixing regions (2) on a first connection carrier (1); introducing solder material (3) into the fixing regions (2); applying a second connection carrier (4) to the fixing regions (2); and soldering the second connection carrier (4) onto the first connection carrier (1) with the solder material (3) in the fixing regions (2).

9 Claims, 7 Drawing Sheets

(56) References Cited

FOREIGN PATENT DOCUMENTS

| | | |
|---|---|---|
| JP | 02130995 | 5/1990 |
| JP | 02177389 | 7/1990 |
| JP | 11219961 | 8/1999 |
| JP | 2004-134648 | 4/2004 |
| JP | 2006-059883 | 3/2006 |
| TW | 1253033 | 4/2006 |
| WO | WO 2004/086845 | 10/2004 |
| WO | WO 2005/039260 | 4/2005 |
| WO | WO 2005/083803 | 9/2005 |

* cited by examiner

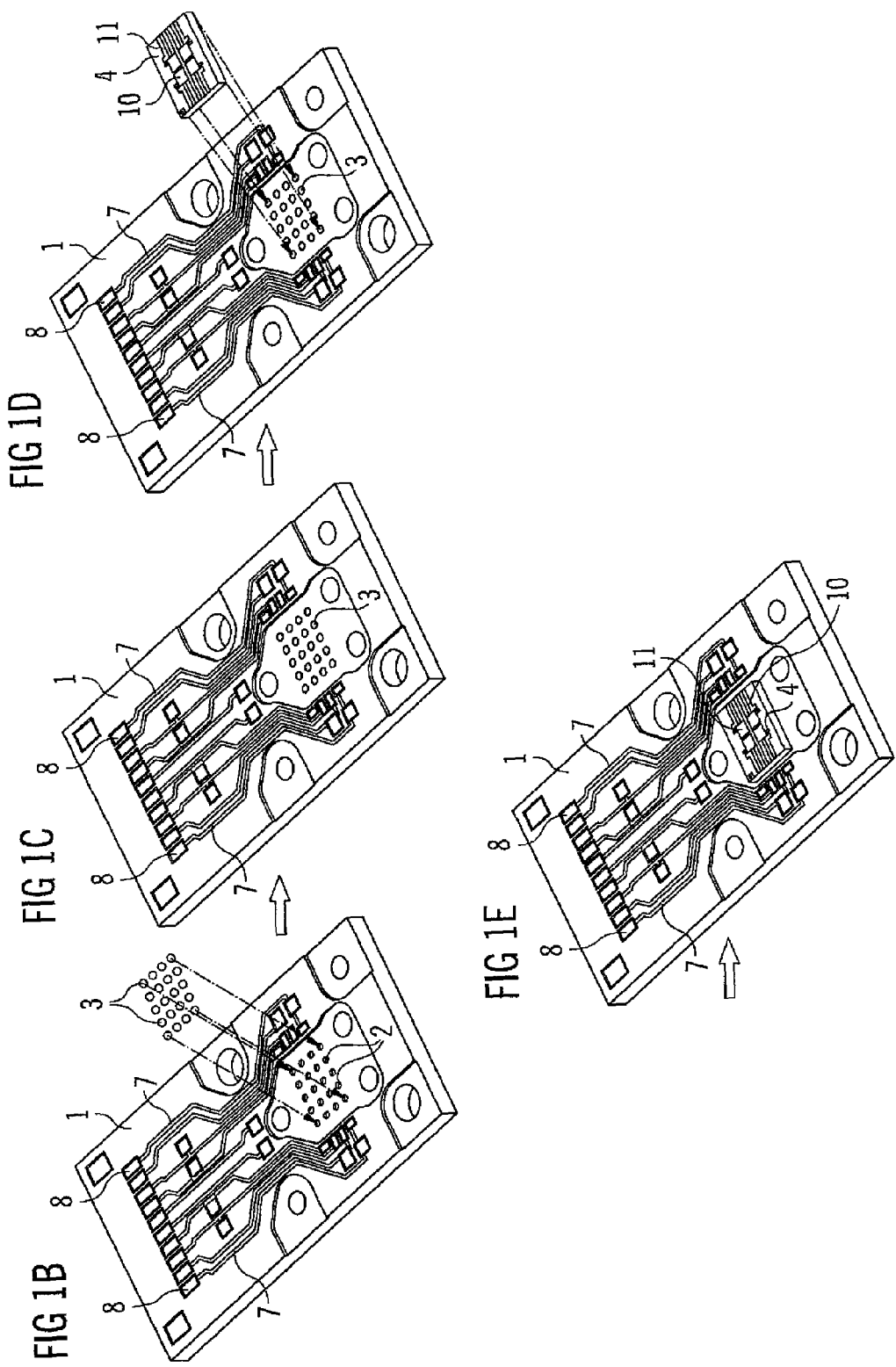

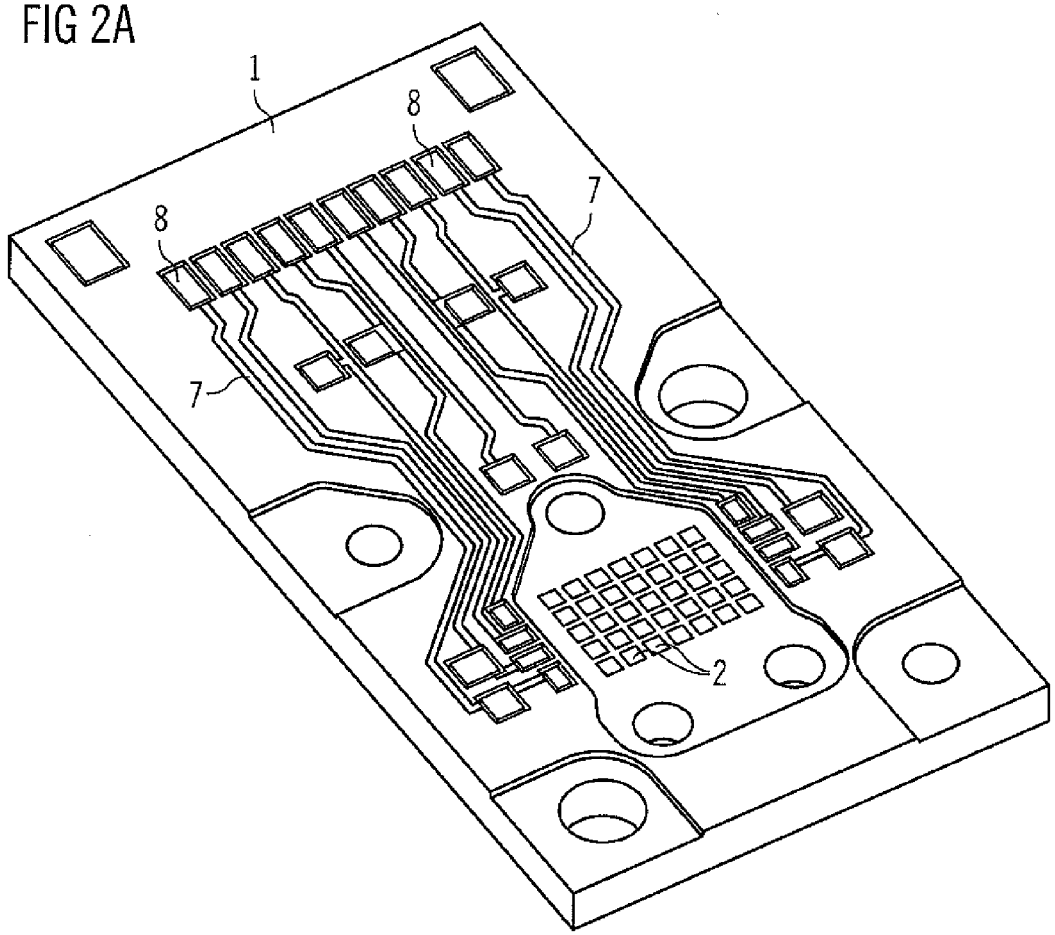

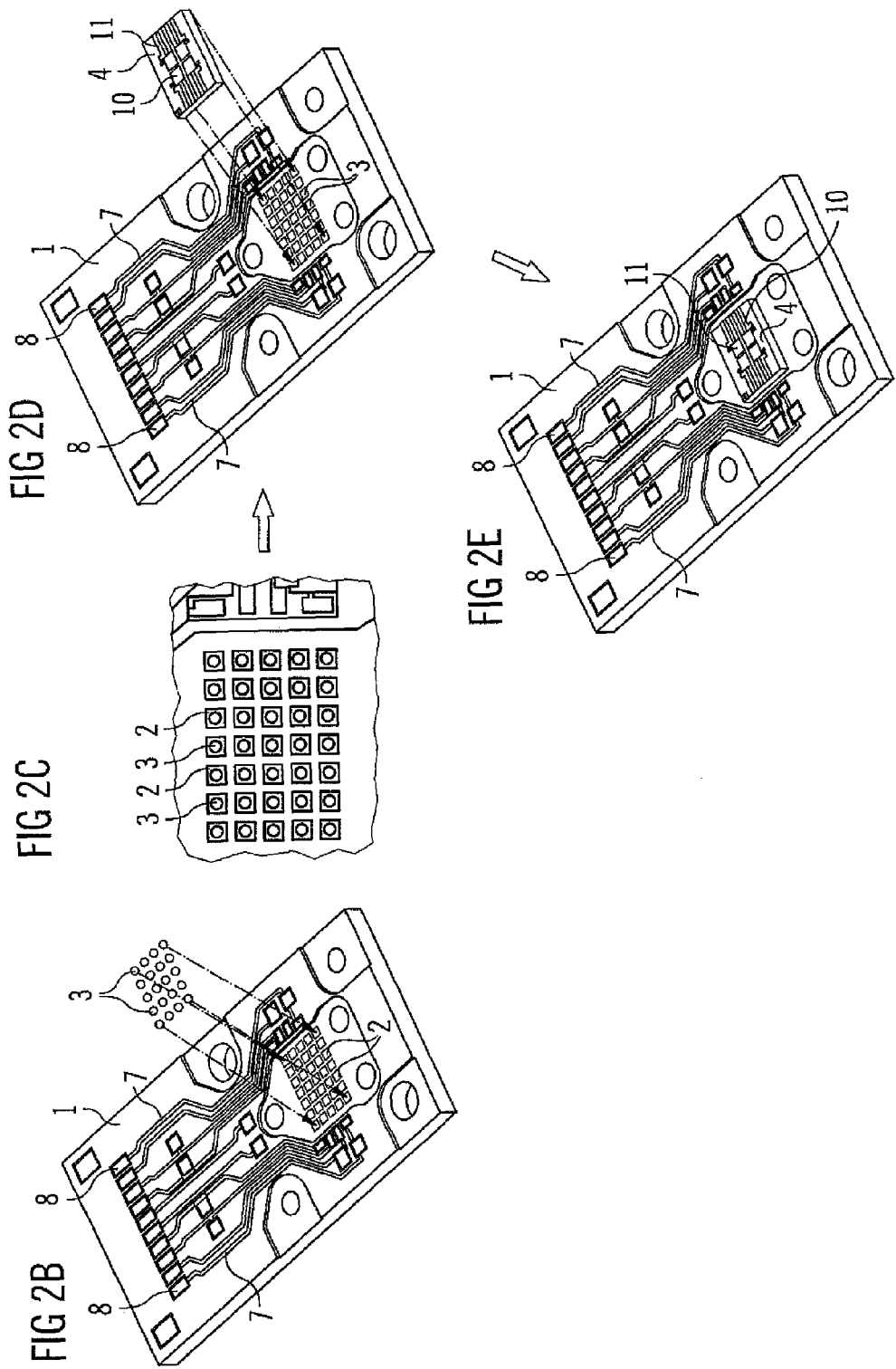

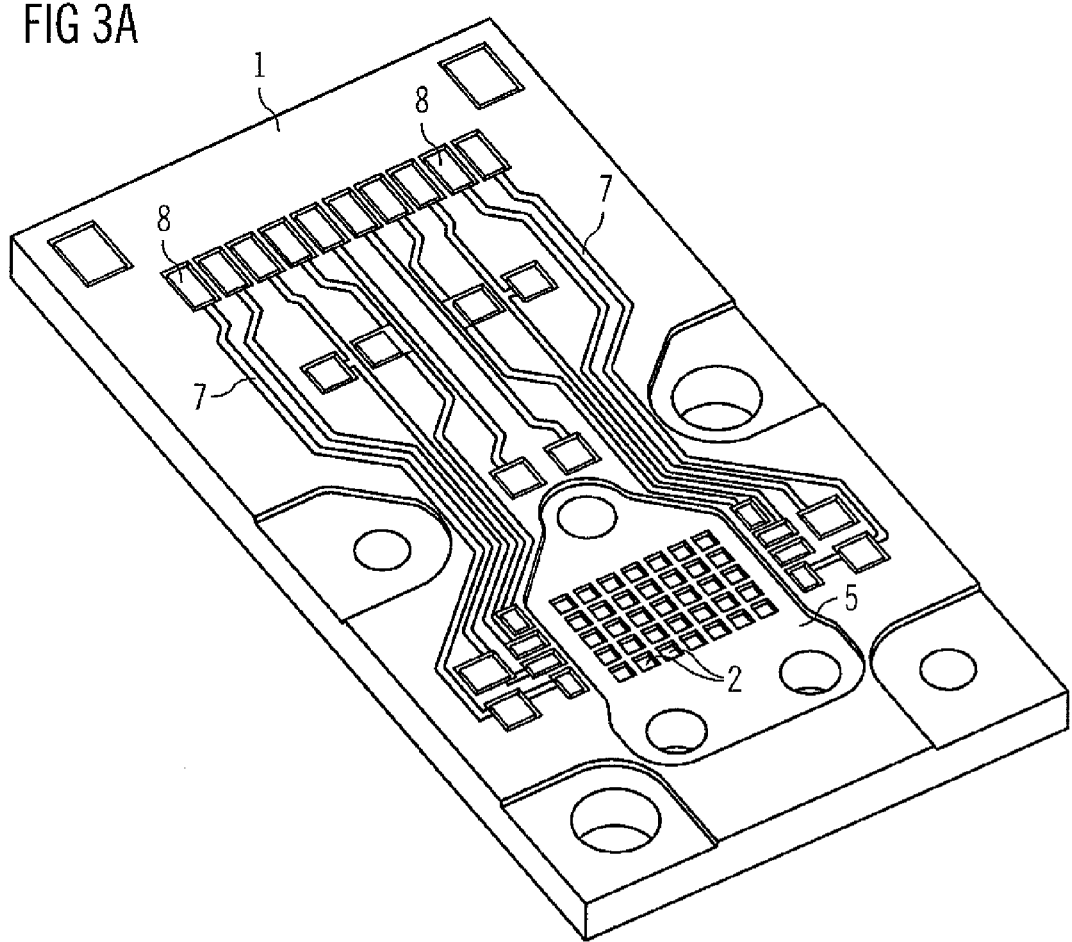

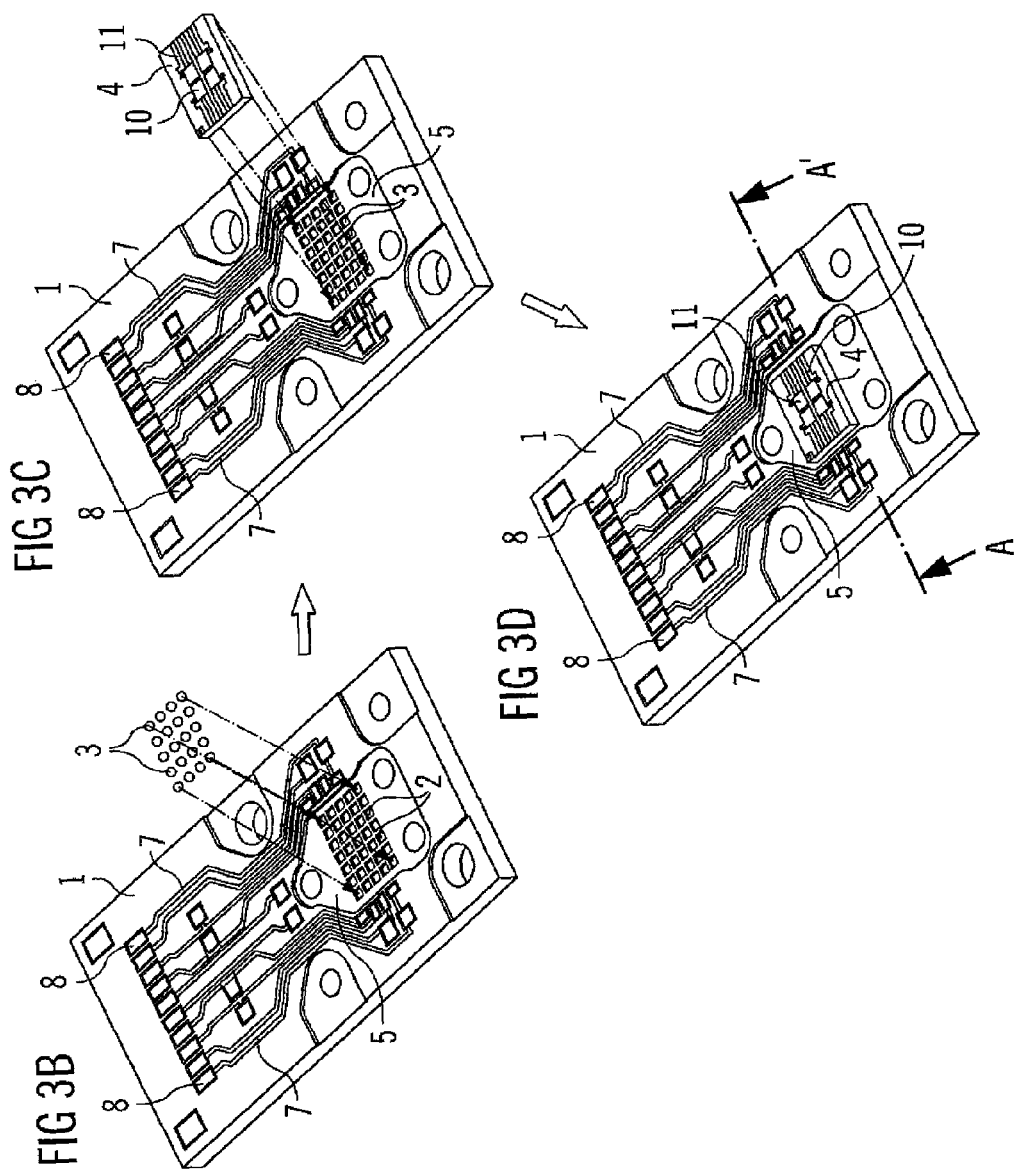

ARRANGEMENT OF OPTOELECTRONIC COMPONENTS

RELATED APPLICATIONS

This is a U.S. national stage under 35 USC §371 of application No. PCT/DE2007/001714, filed on Sep. 21, 2007.

This application claims the priority of German Patent Application Nos. 10 2006 045 129.5 filed Sep. 25, 2006 and 10 2006 059 127.5 filed Dec. 14, 2006, the entire content of both of which is hereby incorporated by reference.

BACKGROUND OF THE INVENTION

The present invention is related to a method for producing an arrangement of optoelectronic components and to an arrangement of optoelectronic components.

The document WO 2005/083803 describes an arrangement of optoelectronic components.

SUMMARY OF THE INVENTION

One object to be achieved consists in specifying a method for producing an arrangement of optoelectronic components which can be carried out particularly cost-effectively. A further object to be achieved consists in specifying an arrangement of optoelectronic components produced by the method.

In accordance with at least one embodiment of the method for producing an arrangement of optoelectronic components, at least two fixing regions are produced on a first connection carrier. The fixing regions are preferably arranged on the surface of the first connection carrier. The fixing regions are suitable for example for receiving a fixing material. The fixing material is preferably a solder material. The fixing regions are preferably spatially separated from one another, that is to say that the fixing regions do not overlap one another.

The first connection carrier is a circuit board, for example, which has a basic body and also conductor tracks which electrically conductively connect connection locations of the circuit board to one another. By way of example, the first connection carrier is a metal-core circuit board.

In accordance with at least one embodiment of the method for producing an arrangement of optoelectronic components, a further method step involves introducing a fixing material—preferably a solder material—into the fixing regions. In this case, the fixing regions are preferably embodied in such a way that they locally bind the solder material. That is to say that the solder material adheres at or in the fixing regions and does not run during melting. In particular, the solder material in one fixing region does not coalesce with the solder material in another fixing region of the first connection carrier.

In accordance with at least one embodiment of the method for producing an arrangement of optoelectronic components, a further method step involves applying a second connection carrier to the fixing regions. The second connection carrier is a circuit board, for example. The circuit board can be embodied for example as a metal-core circuit board or as a circuit board having a ceramic basic body onto which conductor tracks and connection locations are patterned.

In accordance with at least one embodiment of the method for producing an arrangement of optoelectronic components, in a subsequent method step the second connection carrier is mechanically connected to the first connection carrier by means of the fixing material. If the fixing material is a solder material, then the second connection carrier is soldered onto the first connection carrier with the solder material in the fixing regions. In this case, the solder material in the fixing regions preferably produces a thermal and mechanical connection between the two connection carriers. Preferably, the second connection carrier is not electrically contact-connected to the first connection carrier by the solder material. That is to say that the solder material in the fixing regions is not provided for contact-connection or for carrying current.

In accordance with at least one embodiment of the method for producing an arrangement of optoelectronic components, the method comprises the following steps:

firstly, at least two fixing regions are produced on a first connection carrier, subsequently, solder material is introduced into the fixing regions on the first connection carrier, afterward, a second connection carrier is applied to the fixing regions of the first connection carrier and soldered onto the first connection carrier with the solder material in the fixing regions.

In this case, the second connection carrier preferably has a laterally smaller extent than the first connection carrier. This means, for example, that the second connection carrier preferably—after it has been soldered onto the first connection carrier—does not project laterally beyond the latter, but rather terminates at most flush with an edge of the first connection carrier.

An arrangement of optoelectronic components produced in this way is for example a light emitting diode arrangement, a laser diode arrangement or a photodetector arrangement. In this case, the method described here makes use of the idea, inter alia, that an arrangement of optoelectronic components produced by the method has particularly good thermal properties since the solder material in the fixing regions lowers the total thermal resistance of the component. Furthermore, the lifetime of the arrangement is particularly high on account of the high mechanical loadability of the solder material. The arrangement of optoelectronic components is therefore particularly well suited to a use in motor vehicles since it withstands even relatively large mechanical loads over long times without being damaged. On account of the patterning of the solder connection—that is to say the introduction of the solder material into fixing regions which are spatially separated from one another—thermal stresses that occur between the first and second connection carriers can be compensated for particularly well. Furthermore, in the case of a connection of the two connection carriers by solder material in a plurality of fixing regions, the probability of the connection between the first and the second connection carrier breaking apart—that is to say the probability of all the solder connections breaking apart—is relatively low.

Furthermore, the fixing regions produced before the fixing material is applied enable a self-centering of the second connection carrier during application to the first connection carrier. Thus, machines which have a relatively high deviation tolerance and are therefore cost-effective can be used for producing the arrangement of optoelectronic components. Moreover, these machines can then work with a high throughput. Overall, a cost-effective production of arrangements of optoelectronic components is made possible with the method described.

In accordance with at least one embodiment of the method, at least one fixing region is produced by producing a cutout in the first connection carrier. Preferably, all the fixing regions are then produced in this way. The patterning of the first connection carrier is therefore effected in a mechanical and/or chemical manner, for example by one of the following techniques: embossing, milling, eroding, etching. Cutouts are produced in the first connection carrier by means of these techniques, each of the cutouts forming a fixing region.

In accordance with at least one embodiment of the method, at least one fixing region is produced by patterning a soldering resist layer applied to the first connection carrier. For this purpose, by way of example, firstly a soldering resist is applied to a surface of the first connection carrier and is patterned by means of a photo technology. The cutouts patterned into the soldering resist by means of photo technology then form the fixing regions which receive the solder material in the subsequent course of the method.

In accordance with at least one embodiment of the method, firstly a fixing region is produced by applying a metalization to the first connection carrier. In this case, the metalization is applied to the first connection carrier in patterned fashion, such that the metalized regions form the fixing regions. The metalization contains or consists of a metal that can be wetted by solder material, such as, for example, gold, silver, palladium, nickel, palladium/nickel alloy, tin, tin alloys or combinations of these metals. The metalization is applied to the first connection carrier for example by means of a chemical, electrolytic and/or physical coating method such as a PVD coating method.

In accordance with at least one embodiment of the method, the fixing regions are embodied in matrix-like fashion onto the first connection carrier. That is to say that a plurality of fixing regions are arranged in rows and columns.

In accordance with at least one embodiment of the method, fixing regions are produced onto the second connection carrier in the same way as for the first connection carrier. That is to say that at least one fixing region can be produced by producing a cutout in the second connection carrier. At least one fixing region can be produced by applying a metalization to the second connection carrier. At least one fixing region can be produced by patterning a soldering resist layer applied to the second connection carrier. In this case, the fixing regions can be arranged in matrix-like fashion onto the second connection carrier. In this case, it is advantageous, in particular, if each fixing region of the second connection carrier has a fixing region of the first connection carrier assigned to it uniquely or one-to-one. The introduction of solder material can be effected before the soldering process into the fixing regions of the first and/or of the second connection carrier.

However, it is also possible for no fixing regions to be produced onto the second connection carrier. That side of the second connection carrier which faces the first connection carrier then remains unpatterned and is free of fixing regions.

In accordance with at least one embodiment of the method, the solder material in the fixing regions is planarized before the second connection carrier is applied and soldered on. For this purpose, the solder in the fixing regions can be melted and/or planarized with pressure—for example by means of a stamp. A flux melting material can subsequently be introduced by stamping or dispensing onto the individual fixing regions containing the planarized solder material. The remelting and planarization step can be omitted when using a solder paste which is admixed with flux melting material and which is applied for example by means of dispensing, stamping, printing, blade coating. In this case, the second connection carrier is placed directly into the solder paste and soldered on.

In accordance with at least one embodiment of the method, a filling material is introduced between the first and the second connection carrier, said filling material laterally enveloping the solder material at least in places. In this case, the filling material can be introduced into the fixing region before or after the second connection carrier is applied to the first connection carrier.

In accordance with at least one embodiment of the method, the filling material is non-adhesive, that is to say that it does not impart a mechanical connection between the two connection carriers. The filling material preferably has good thermal conductivity and improves the thermal connection between the two connection carriers in addition to the solder material. By way of example, thermally conductive pastes based on ceramic or silver particles are suitable as non-adhesive filling materials.

In accordance with at least one embodiment of the method, the filling material is adhesive, that is to say that it imparts a mechanical connection between the two connection carriers in addition to the solder material. The filling material preferably has a good thermal conductivity and improves the thermal connection between the two connection carriers in addition to the solder material. By way of example, thermally conductive adhesives based on ceramic or silver particles are suitable as adhesive filling materials.

In accordance with at least one embodiment of the method, before the second connection carrier is applied—in particular before the second connection carrier is soldered on—at least one optoelectronic component—for example an optoelectronic semiconductor chip such as a light emitting diode chip, a laser diode chip or a photodetector chip—is applied to a chip connection region of the second connection carrier. This means that a second connection carrier already populated with optoelectronic semiconductor chips is soldered onto the first connection carrier.

An arrangement of optoelectronic components is furthermore specified.

In accordance with at least one embodiment of the arrangement, the arrangement comprises a first connection carrier, which has at least two fixing regions into which a solder material is introduced. The fixing regions are preferably arranged on the surface of the first connection carrier. The fixing regions are preferably spatially separated from one another, that is to say that the fixing regions do not overlap one another. In this case, the fixing regions are preferably embodied in such a way that they locally bind the solder material. That is to say that the solder material adheres at or in the fixing regions. In particular, the solder material in one fixing region is not connected to the solder material in another fixing region of the first connection carrier.

The first connection carrier is for example a circuit board having a basic body and also conductor tracks which electrically conductively connect connection locations of the circuit board to one another. By way of example, the first connection carrier is a metal-core circuit board.

In accordance with at least one embodiment of the arrangement of optoelectronic components, the arrangement furthermore comprises a second connection carrier, which is mechanically connected to the first connection carrier by the solder material in the fixing regions. The second connection carrier is a circuit board, for example. The circuit board can be embodied for example as a metal-core circuit board or as a circuit board having a ceramic basic body onto which conductor tracks and connection locations are patterned.

In accordance with at least one embodiment of the arrangement of optoelectronic components, the arrangement comprises at least one optoelectronic component—for example an optoelectronic semiconductor chip—which is applied to that side of the second connection carrier which is remote from the first connection carrier. In this case, the optoelectronic component has preferably been fixed on the second connection carrier before the second connection carrier is soldered onto the first connection carrier. The optoelectronic component is for example one of the following semiconductor chips: light emitting diode chip, laser diode chip, photodetector chip.

In accordance with at least one embodiment of the arrangement of optoelectronic components, the arrangement comprises the following component parts:
- a first connection carrier, which has at least two fixing regions into which a solder material is introduced,
- a second connection carrier, which is mechanically connected to the first connection carrier by the solder material in the fixing regions, and
- at least one optoelectronic component applied to that side of the second connection carrier which is remote from the first connection carrier.

In accordance with at least one embodiment of the arrangement of optoelectronic components, the solder material in the fixing regions is not provided for the electrical connection of the optical semiconductor chips. This means that the solder material does not serve for carrying current between the first connection carrier and the second connection carrier, but rather imparts a thermal and mechanical connection between these two connection carriers. The connection of the semiconductor chips to the first connection carrier can be effected for example by means of wire contacts or separate solder connections that are not arranged in a fixing region of the first connection carrier.

In accordance with at least one embodiment, fixing regions of the first connection carrier are arranged in matrix-like fashion. That is to say that the fixing regions are arranged in rows and columns. By way of example, the envelope of all the fixing regions of the first connection carrier has a rectangular or square form. In principle, however, all two-dimensional geometries, in particular including circular or triangular envelopes, are possible for the envelope.

In accordance with at least one embodiment of the arrangement of optoelectronic components, a filling material is situated between the first connection carrier and the second connection carrier, said filling material laterally enveloping the solder material at least in places. Preferably, the filling material laterally envelops the solder material completely. That is to say that the space between the first and the second connection carrier is then completely filled with solder material and the filling material.

The filling material is a material which has a good thermal conductivity and which, in addition to the solder material, imparts a thermal connection between the first connection carrier and the second connection carrier. In this case, the filling material is non-adhesive, for example, such that it does not impart a mechanical connection between the first connection carrier and the second connection carrier. However, it is also possible for the filling material to be adhesive and to impart a further mechanical connection between the connection carriers in addition to the solder material.

In accordance with at least one embodiment of the arrangement of optoelectronic components, the second connection carrier has a basic body which consists of a ceramic material or contains a ceramic material. By way of example, the basic body contains or consists of at least one of the following materials: an aluminum nitride, glass, polycrystalline $Al_2O_3$, monocrystalline $Al_2O_3$, silicon. Connection locations and also conductor tracks are patterned on the basic body of the second connection carrier.

BRIEF DESCRIPTION OF THE DRAWINGS

The method described here and also the arrangement of optoelectronic components described here are explained in more detail below on the basis of exemplary embodiments and the associated figures.

FIGS. 1A, 1B, 1C, 1D, 1E show schematic perspective illustrations on the basis of which a first exemplary embodiment of a method described here is elucidated in greater detail.

FIGS. 2A, 2B, 2C, 2D and 2E elucidate, on the basis of schematic perspective illustrations, a second exemplary embodiment of a method for producing an arrangement of optoelectronic components described here.

FIGS. 3A, 3B, 3C and 3D elucidate, on the basis of schematic perspective illustrations, a third exemplary embodiment of a method for producing an arrangement of optoelectronic components described here.

DETAILED DESCRIPTION OF THE DRAWINGS

In the exemplary embodiments and figures, identical or identically acting constituent parts are in each case provided with the same reference symbols. The elements illustrated should not be regarded as true to scale; rather, individual elements may be illustrated with an exaggerated size in order to afford a better understanding.

FIGS. 1A, 1B, 1C, 1D, 1E show schematic perspective illustrations on the basis of which a first exemplary embodiment of a method described here is elucidated in greater detail.

Figure 1A:
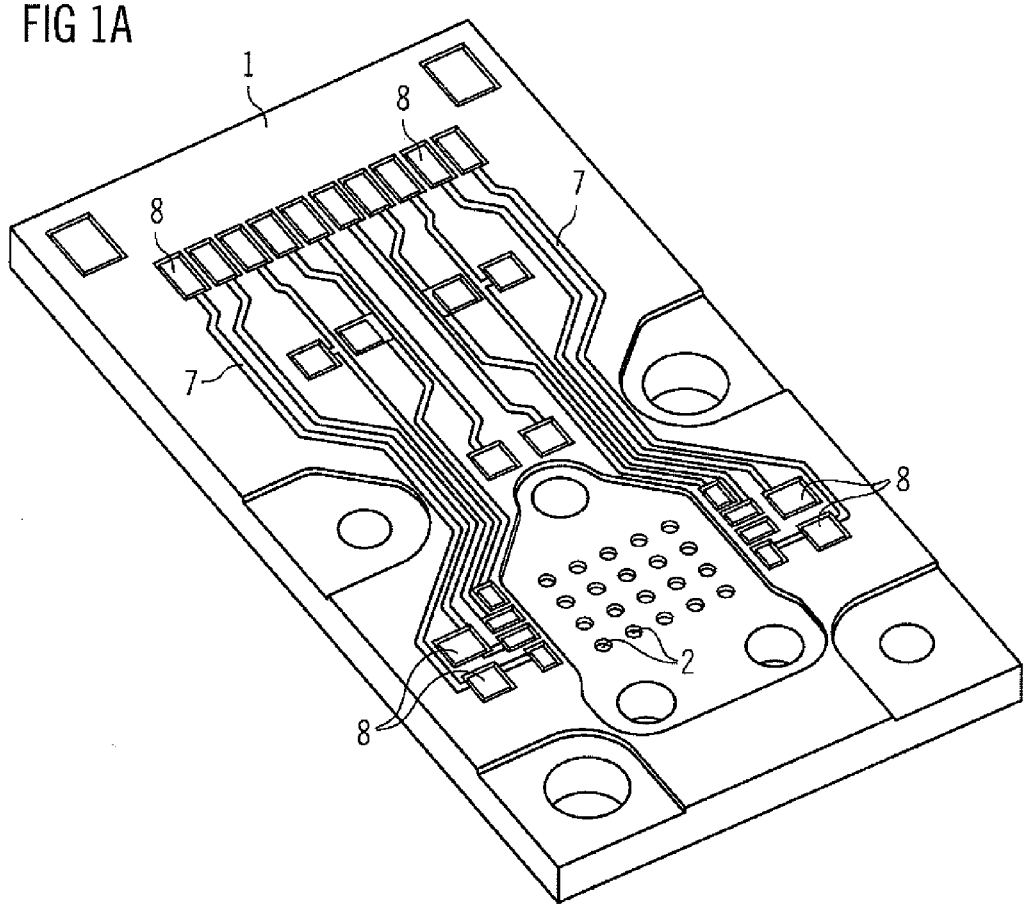

FIG. 1A shows a schematic perspective illustration of a first connection carrier 1. The first connection carrier 1 has a multiplicity of conductor tracks 7 which electrically conductively connect connection locations 8 of the connection carrier 1 to one another. The first connection carrier 1 is a metal-core circuit board, for example.

The connection carrier 1 has a multiplicity of fixing regions 2. The fixing regions 2 are arranged in matrix-like fashion. In the present exemplary embodiment, the fixing regions 2 are arranged in four rows each of five columns. The fixing regions 2 are formed by cutouts in the first connection carrier 1. The cutouts are produced chemically and/or mechanically, for example by one of the following techniques: embossing, milling, eroding, etching. Cutouts are produced in the first connection carrier by these techniques, said cutouts each forming a fixing region 2.

A next method step of a first exemplary embodiment of a method for producing an arrangement of optoelectronic components described here is described with reference to FIG. 1B. In this method step, solder material 3—in the present case in the form of solder balls—is introduced into the fixing regions 2. In this case, the solder material 3 is sunk in the fixing regions 2 formed by cutouts.

A further method step is explained in conjunction with FIG. 1C. In this method step, the solder material 3 is remelted and planarized. By way of example, a stamp can be used for planarization.

A further method step of the first exemplary embodiment of a method described here is explained in conjunction with FIG. 1D. In this method step, a second connection carrier 4 is applied to the fixing regions 2 with the solder material 3. The second connection carrier 4 in the present case is a connection carrier having a ceramic basic body on which conductor tracks 11 are patterned. Optoelectronic components 10—in the present case light emitting diode chips—have already been applied to the second connection carrier 4.

FIG. 1E elucidates a further method step of the first exemplary embodiment of a method for producing an arrangement of optoelectronic components described here. In this method step, the emplaced second connection carrier 4 is fixed with flux melting material and soldered onto the first connection carrier 1 for example by means of a reflow soldering technique. In this case, the mechanical connection between the first connection carrier 1 and the second connection carrier 4 is produced by the solder material in the fixing regions 2.

FIGS. 2A, 2B, 2C, 2D and 2E elucidate, on the basis of schematic perspective illustrations, a second exemplary embodiment of a method for producing an arrangement of optoelectronic components described here. In contrast to the exemplary embodiment described in conjunction with FIGS. 1A to 1E, in this exemplary embodiment the fixing regions 2 are formed by metalizations of the surface of the first connection carrier 1. In this case, the metalizations are applied to the first connection carrier in patterned fashion, such that the metalized regions form the fixing regions 2. The metalizations contain or consist of a metal that can be wetted by solder material, such as, for example, gold, silver, palladium, nickel, palladium/nickel alloy, tin, tin alloys or combinations of these metals. The metalizations are applied to the first connection carrier for example by means of a chemical, electrolytic and/or physical coating method such as PVD.

The schematic perspective illustration in FIG. 2B shows that solder material 3 is introduced into the fixing regions 2 formed by the metalizations.

On the basis of the schematic plan view in FIG. 2C it is elucidated that in a subsequent method step of the second exemplary embodiment of a method described here, the solder material is remelted and planarized. In this case, the solder material 3 remains in the fixing regions 2. That is to say that the solder material 3 from different fixing regions 2 does not run to form a single, larger solder lump but rather remains separate from one another.

A further method step of the second exemplary embodiment of a method described here is explained in conjunction with FIG. 2D. In this method step, a second connection carrier 4 is applied to the fixing regions 2 with the solder material 3. The second connection carrier 4 in the present case is a connection carrier having a ceramic basic body on which conductor tracks 11 are patterned. Optoelectronic components 10—in the present case light emitting diode chips—have already been applied to the second connection carrier 4.

FIG. 2E elucidates a further method step of the second exemplary embodiment of a method for producing an arrangement of optoelectronic components described here. In this method step, the emplaced second connection carrier 4 is fixed with flux melting material and soldered onto the first connection carrier 1 for example by means of a reflow soldering technique. In this case, the mechanical connection between the first connection carrier 1 and the second connection carrier 4 is produced by the solder material in the fixing regions 2.

FIGS. 3A, 3B, 3C and 3D elucidate, on the basis of schematic perspective illustrations, a third exemplary embodiment of a method for producing an arrangement of optoelectronic components described here. In contrast to the exemplary embodiments described in conjunction with FIGS. 1A to 1E and 2A to 2E, respectively, in this exemplary embodiment the fixing regions 2 are formed by cutouts in a soldering resist layer 5. For this purpose, by way of example, firstly a soldering resist layer 5 is applied to a surface of the first connection carrier 1 and patterned by means of a photo technology. The cutouts patterned into the soldering resist layer 5 by means of the photo technology then form the fixing regions 2 which receive the solder material 3 in the subsequent course of the method.

On the basis of the schematic perspective illustration in FIG. 3B it is elucidated that in a subsequent method step solder material 3 is introduced into the fixing regions 2.

A further method step of the third exemplary embodiment of a method described here is explained in conjunction with FIG. 3C. In this method step, a second connection carrier 4 is applied to the fixing regions 2 with the solder material 3. The second connection carrier 4 in the present case is a connection carrier having a ceramic basic body on which conductor tracks 11 are patterned. Optoelectronic components 10 such as light emitting diode chips, for example, have already been applied to the second connection carrier 4.

A further method step of the third exemplary embodiment of a method for producing an arrangement of optoelectronic components described here is explained with reference to FIG. 3D. In this method step, the emplaced second connection carrier 4 is fixed with flux melting material and soldered onto the first connection carrier 1 for example by means of a reflow soldering technique. In this case, the mechanical connection between the first connection carrier 1 and the second connection carrier 4 is imparted by the solder material in the fixing regions 2.

Figure 4:
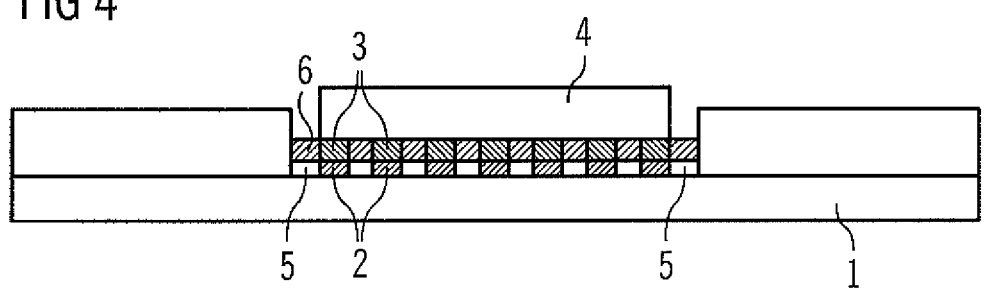
FIG. 4 shows, in a schematic sectional illustration, an arrangement of optoelectronic components described here along the section AA' as shown in FIG. 3D.

FIG. 4 shows, in a schematic sectional illustration, an arrangement of optoelectronic components described here along the section AA' as shown in FIG. 3D. In this exemplary embodiment, the fixing regions 2 are formed by cutouts in a soldering resist layer 5. The cutouts are filled with solder material 3. The solder material 3 is laterally enveloped by a non-adhesive filling material 6, which imparts a thermally conductive connection between the first connection carrier 1 and the second connection carrier 4. In this case, the mechanical connection between the first connection carrier 1 and the second connection carrier 4 is imparted by the solder material 3 in the fixing regions 2. In particular, the solder material 3 does not electrically connect optoelectronic components 10 on the second connection carrier to the first connection carrier 1. That is to say that the solder material 3 is not provided for the contact-connection of the optoelectronic components 10.

As an alternative, however, it is also possible for the filling material 6 to be adhesive and to impart a further mechanical connection between the connection carriers 1, 4 in addition to the solder material 3.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. An arrangement of optoelectronic components comprising:
a first connection carrier including at least two fixing regions into which a solder material is introduced and further including at least one first conductor track;
a circuit board mechanically connected to the first connection carrier by the solder material in the at least two fixing regions and including at least one second conductor track; and
at least one optoelectronic component applied to that side of the circuit board which is remote from the first connection carrier;
wherein the solder material is electrically isolated from the at least one first and at least one second conductor tracks, such that the solder material in the at least two fixing regions does not serve to electrically connect the at least one optoelectronic component.

2. The arrangement as claimed in claim 1, wherein the solder material in the at least two fixing regions does not serve to electrically interconnect the arrangement of optoelectronic components.

3. The arrangement as claimed in claim 2, wherein the at least two fixing regions are arranged in a matrix-like manner.

4. The arrangement as claimed in claim 1, wherein a filling material is arranged between the first connection carrier and the circuit board, said filling material laterally enveloping the solder material at least in places.

5. The arrangement as claimed in claim 4, wherein the filling material is non-adhesive.

6. The arrangement as claimed in claim 4, wherein the filling material is adhesive.

7. The arrangement as claimed in claim 4, wherein the filling material laterally envelops the solder material completely.

8. The arrangement as claimed in claim 1, wherein the circuit board contains a ceramic material.

9. The arrangement as claimed in claim 1, wherein the at least one second conductor track comprises conductor tracks electrically conductively interconnecting connection locations of the circuit board to one another.

* * * * *